United States Patent
Imtiaz

(10) Patent No.: US 8,004,321 B2
(45) Date of Patent: Aug. 23, 2011

(54) METHOD OF IMPLEMENTING POWER-ON-RESET IN POWER SWITCHES

(75) Inventor: S.M. Sohel Imtiaz, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 48 days.

(21) Appl. No.: 12/122,020

(22) Filed: May 16, 2008

(65) Prior Publication Data

US 2009/0284289 A1    Nov. 19, 2009

(51) Int. Cl.
*H03L 7/00* (2006.01)
(52) U.S. Cl. ................................................... 327/143
(58) Field of Classification Search .............. 327/142, 327/143, 198
See application file for complete search history.

(56) References Cited

U.S. PATENT DOCUMENTS

| | | | |
|---|---|---|---|
| 5,051,610 A * | 9/1991 | Terane et al. | 327/210 |
| 5,650,673 A * | 7/1997 | Maeda | 307/141.4 |
| 6,388,479 B1 * | 5/2002 | Gupta et al. | 327/143 |
| 7,671,643 B2 * | 3/2010 | Dribinsky et al. | 327/142 |
| 2009/0115390 A1 * | 5/2009 | Chen et al. | 323/283 |

OTHER PUBLICATIONS

Wikipedia, "Power-on reset", http://en.wikipedia.org/wiki/Power-on_reset, Aug. 20, 2007, 1 Page.
Signal Consulting, Inc., "Power-On-Reset", http://sigcon.com/Pubs/edn/por.htm, Aug. 20, 2007, 2 Pages.
Maxim, "Power-On Reset and Related Supervisory Functions", http://www.maxim-ic.com/appnotes.cfm/an_pk/3227, Aug. 20, 2007, 7 page.
ACTEL Corporation, "A Power-On Reset (POR) Circuit for Actel Devices", http://klabs.org/richcontent/fpga_content/ DesignNotes/PowerOnReset.pdf, Sep. 1997, 2 Pages.

* cited by examiner

*Primary Examiner* — Lincoln Donovan
*Assistant Examiner* — Daniel Rojas
(74) *Attorney, Agent, or Firm* — Sawyer Law Group, P.C.

(57) ABSTRACT

A power switch circuit and method is provided for having the capability of (1) a power switch circuit having a POR in which the switch is enabled at a predetermined voltage such that the switch is unable to be activated when a minimum lower input voltage is not achieved, to avoid potential conflicts in synchronization and resets with other integrated circuits or chips of an affected system; (2) a POR designed with a delay circuit providing for coordinated stabilization of the power switch before each ON-OFF transition period; (3) using a controlled peaking current in the POR circuit to provide precise RC delay to avoid instability during transition; and (4) a POR providing an externally controlled voltage to power-up other components in the system when energizing of the first component occurs satisfactorily.

13 Claims, 4 Drawing Sheets

US 8,004,321 B2

METHOD OF IMPLEMENTING POWER-ON-RESET IN POWER SWITCHES

FIELD OF THE INVENTION

This present invention generally relates to power-on reset circuits and in particular to a power-on reset circuit implemented in power switches.

BACKGROUND OF THE INVENTION

A power-on reset (POR) generator is a microcontroller or microprocessor peripheral that generates a reset signal when power is applied to the device. A POR ensures that the device starts operating in a known state. Typically in very large-scale integration (VLSI) devices, where the current level of computer microchip miniaturization is complex and refers to microchips containing in the hundreds of thousands of transistors, the POR is an electronic device incorporated into the integrated circuit that detects the power applied to the chip. The POR generates a reset impulse to the entire circuit placing the circuit of affected chip into a known state.

A typical power switch consists of a large P-channel Metal Oxide Semiconductor (PMOS), a buffer, and a level-shifter circuit.

A simple POR comprises an RC device that charges with the rising of the supply voltage. It is understood to use a Schmitt trigger such that the rising charged voltage of the RC network generates an impulse. This impulse is generated based on the two threshold voltages of the Schmitt trigger. When the input voltage at the Schmitt trigger coming from the RC network reaches the first threshold voltage the output of the Schmitt trigger switches so that it generates the first edge of the input. The charging of the RC network should be long enough so that the POR can reset all the internal circuits before the charging voltage reaches the other threshold voltage of the Schmitt trigger and the output to switch back.

FIG. 1 depicts a typical POR circuit 12 as known in the prior art. In the circuit of FIG. 1, Vcc voltage 2 represents the voltage from a power supply which is not shown and POR 10 represents the power-on reset signal which is generated by a Schmitt trigger 8. Before the power supply is turned on, the POR 10 is low since capacitor 6 is discharged and since the Schmitt trigger 8 does not have any source of power (since it is also powered by the power supply). When the power supply is turned on, the Vcc voltage 2 rises and begins to charge capacitor 6 through resistor 4 and power the Schmitt trigger 8. Until the Schmitt trigger 8 has sufficient voltage to operate, its output is in an indeterminate state. When the voltage on capacitor 6 reaches the threshold voltage of the Schmitt trigger 8, the output of the Schmitt trigger changes to a high state and thus the POR signal 10 swings to a high state.

Prior art power-on reset circuit 12 in FIG. 1 is limited to situations where Vcc has a rise time at turn-on that is much faster than the RC time constant. As a result, large resistors and capacitors are required for those power supplies which have long rise times. The large capacitors can use a significant amount of area on an integrated circuit. Additionally, the POR output is indeterminate at VCC voltages below the operating voltage of the Schmitt trigger 8.

One task of the traditional POR is ensuring that the processor starts at a known address when power is first applied. To accomplish that task, the POR logic output holds the processor in its reset state when the processor's power supply is first turned on. Typically, the POR's second task is to keep the processor from starting its operation from that known address until three events have occurred: (1) the system power supplies have stabilized at the appropriate level; (2) the processor's clock(s) have settled; and (3) the internal registers have been properly loaded.

System designers readily embrace a traditional POR and in particular their designs often involve providing for disabling the microprocessor with a POR until the power supply has reached a sufficient and stable voltage for the microprocessor to operate reliably. Therefore, by disabling the microprocessor with a power-on reset circuit until the power supply provides a known good voltage, errors in the microprocessor due to low voltage and/or noise are avoided.

While a POR is recognized to be a good voltage source necessary for powering on to reset synchronous circuitry, unfortunately, a POR only provides an impulse at a particular time and is unable to provide other inputs to a circuit, such as an externally controlled voltage for powering-up other components in the circuit or for providing power through switching during a transition period between ON and OFF functions. Examples of devices which benefit from traditional POR activities include microprocessor-based system such as a personal computer, an automobile, or a radio, for example. Many devices in use today, consumer and non-consumer type products, which use electronics, often employ a traditional POR to provide enabling of the operation of the electronics when a reliable power source is available and disabling the operation of the electronics when the reliable power source is not available.

Accordingly, what is needed is a Power-on-reset (POR) circuit implemented in a power switch to enable the switch at a predefined voltage and to power-up successive integrated circuits after initially energizing a first circuit without over-current or over-voltage effects in the circuit.

SUMMARY OF THE INVENTION

Power-on-reset (POR) circuit has been implemented in power switches to enable the switch at a predefined voltage and to power up the successive integrated circuits. A controlled peaking current is used in the POR circuit to provide precise RC delay to avoid instability during transition.

In one implementation of the present invention, the present invention is a power switch circuit comprising: a power switch including a P-channel Metal Oxide Semiconductor (PMOS), a buffer, and a level-shifter circuit; a power-on reset (POR) circuit configured for a peaking current technique to generate a current and for generating a power-on reset (POR) signal; a delay circuit; and an active low reset (PORB) signal for enabling a control loop of the power switch, wherein the POR provides for activating the switch by the PORB signal at a predetermined voltage being at least of a minimum lower input voltage.

In another implementation of the present invention, the present invention is a method of implementing a power-on reset in a power switch circuit to enable the switch at a predefined voltage and to power-up successive integrated circuits, the method comprising: providing for a power switch including a P-channel Metal Oxide Semiconductor (PMOS), a buffer, and a level-shifter circuit; providing for a power-on reset (POR) circuit configured for a peaking current technique to generate a current and for generating a power-on reset (POR) signal; providing for a delay circuit; and providing for an active low reset (PORB) signal for enabling a control loop of the power switch, activating the switch by the PORB signal at a predetermined voltage being at least of a minimum lower input voltage and processing the PORB signal to generate a suitable input voltage (PON) capability for a successive integrated circuit.

DETAILED DESCRIPTION

The following description is presented to enable one of ordinary skill in the art to make and use the embodiment and is provided in the context of a patent application and its requirements. Various modifications to the embodiments and the generic principles and features described herein will be readily apparent to those skilled in the art. Thus, the present embodiment is not intended to be limited to the embodiments shown, but is to be accorded the widest scope consistent with the principles and features described herein.

In various implementations herein, the present invention provides for: (1) a power switch having a POR in which the switch is enabled at a predetermined voltage such that the switch is unable to be activated when a minimum lower input voltage is not achieved, to avoid potential conflicts in synchronization and resets with other integrated circuits or chips of an affected system; (2) a POR designed with a delay circuit providing for coordinated stabilization of the power switch before each ON-OFF transition period, wherein by providing for such stabilization, the POR of the present invention prevents any over-voltage or over-current generation in the circuit; (3) using a controlled peaking current in the POR circuit to provide precise RC delay to avoid instability during transition; and (4) a POR providing an externally controlled voltage to power-up other components in the system when energizing of the first component occurs satisfactorily.

In one implementation of the present invention, an active low reset (PORB) (i.e., inverted POR) signal is added to the enable control loop of the power switch. Additional circuits are designed to add POR and delay as shown in FIG. 2.

Figure 1:
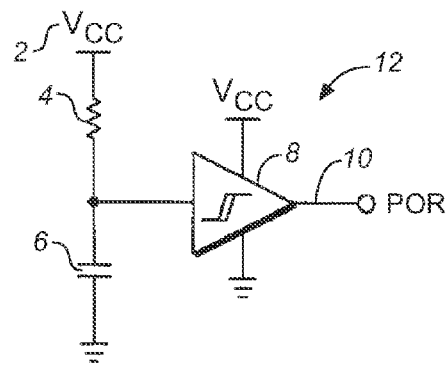
FIG. 1 depicts a typical POR circuit as known in the prior art.
Figure 2:
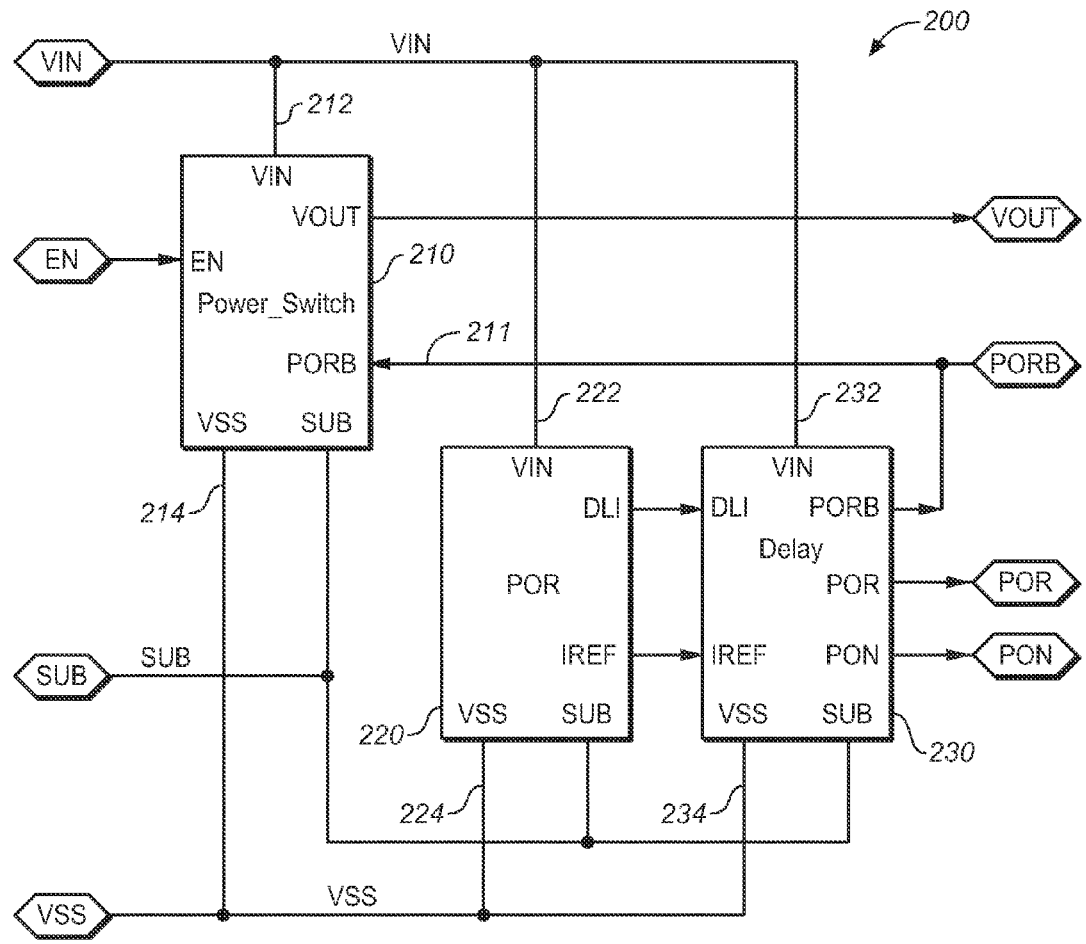
FIG. 2 shows the top level of power switch with power-on-reset POR and delay (200) in accordance with a preferred implementation of the present invention.

FIG. 2 shows the top level of power switch with power-on-reset POR and delay (200) in accordance with a preferred implementation of the present invention. From FIG. 2 the power switch is set forth at 210, the POR is set forth at 220 and the Delay circuit is set forth at 230. The Power Switch 210 receives the active low reset signal (PORB) at 211. The $V_{IN}$ is provided at 212, 222 and 232 to the switch, POR and delay circuit respectively. The supply voltage $V_{SS}$ is at 214, 224 and 234 with respect to the switch, POR and delay circuit.

Figure 3:
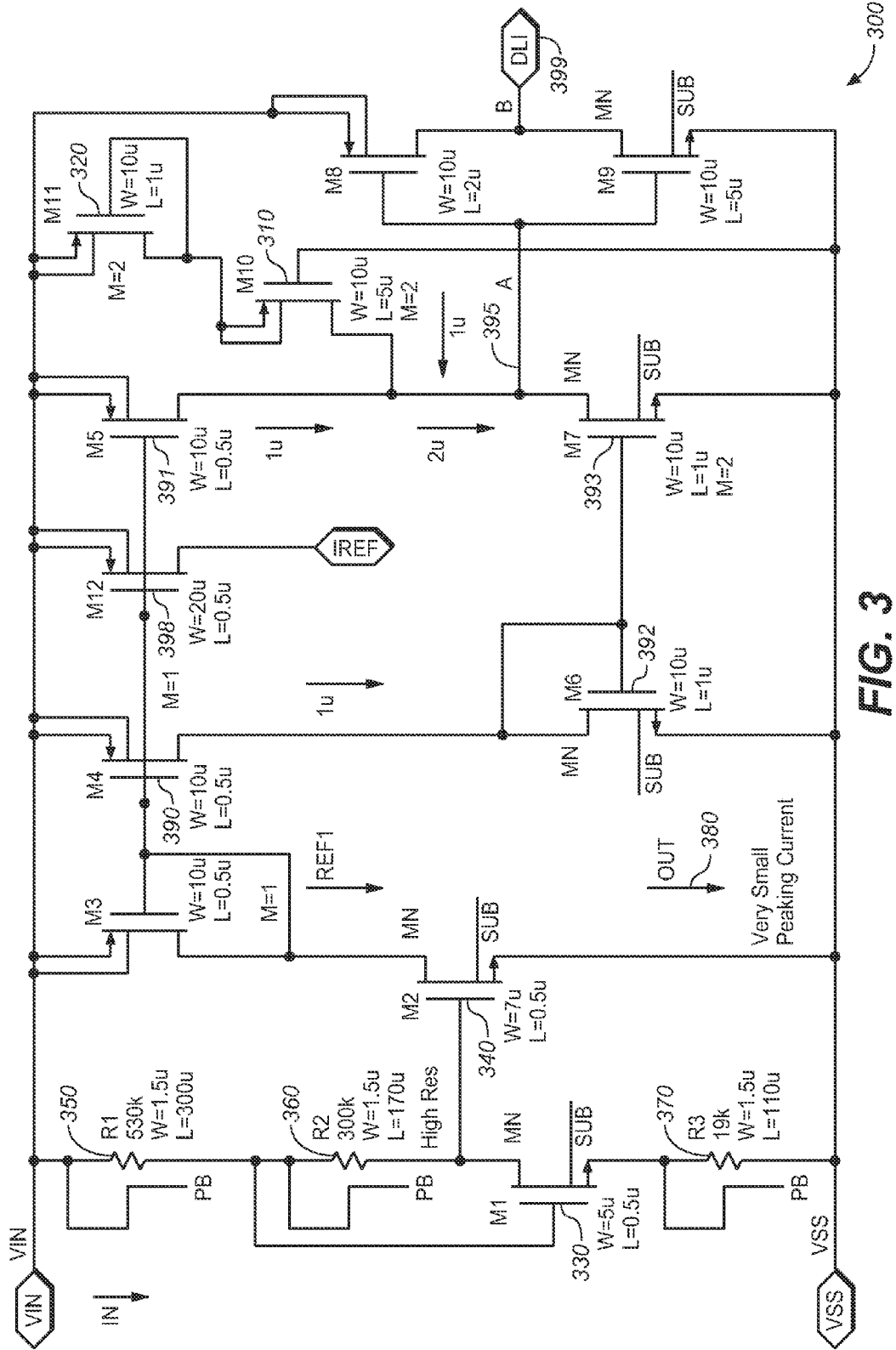
FIG. 3 shows the POR circuit which is enabled at a pre-defined or predetermined voltage using M10 and M1, in accordance with one implementation of the present invention

FIG. 3 shows the POR circuit which is enabled at a pre-defined or predetermined voltage using M10 and M11 (310 and 320, respectively) in accordance with one implementation of the present invention. The pre-defined or predetermined voltage is that which is a minimum lower input voltage such that the switch is unable to be activated when the minimum lower input voltage is not achieved. The minimum lower input voltage is determined to avoid potential conflicts in synchronization and resets with other integrated circuits or chips of an affected system. Thus, a POR designed with a delay circuit in accordance with the present invention provides for coordinated stabilization of the power switch before each ON-OFF transition period, wherein by providing for such stabilization, the POR of the present invention prevents any over-voltage or over-current generation in the circuit.

In FIG. 3, a peaking current technique is implemented with M1 (330), M2 (340), R1 (350), R2 (360) and R3(370) to generate a small current at 380. The loop consisting of PMOS devices M4 (390) and M5 (391), NMOS devices M6 (392) and M7 (393) make the voltage at point A (395) low as M7 (393) is 2× larger than M6 (392). When the input voltage reaches two times the threshold voltage of PMOS, M10 (310) and M11 (320) turn on and supply enough current to change the state of point A from low to high. The output (399) of the POR circuit goes through several buffer stages in the delay block (see FIG. 4). Thus, using a controlled peaking current in the POR circuit, precise RC delay can be provided to avoid instability during transition.

Figure 4:
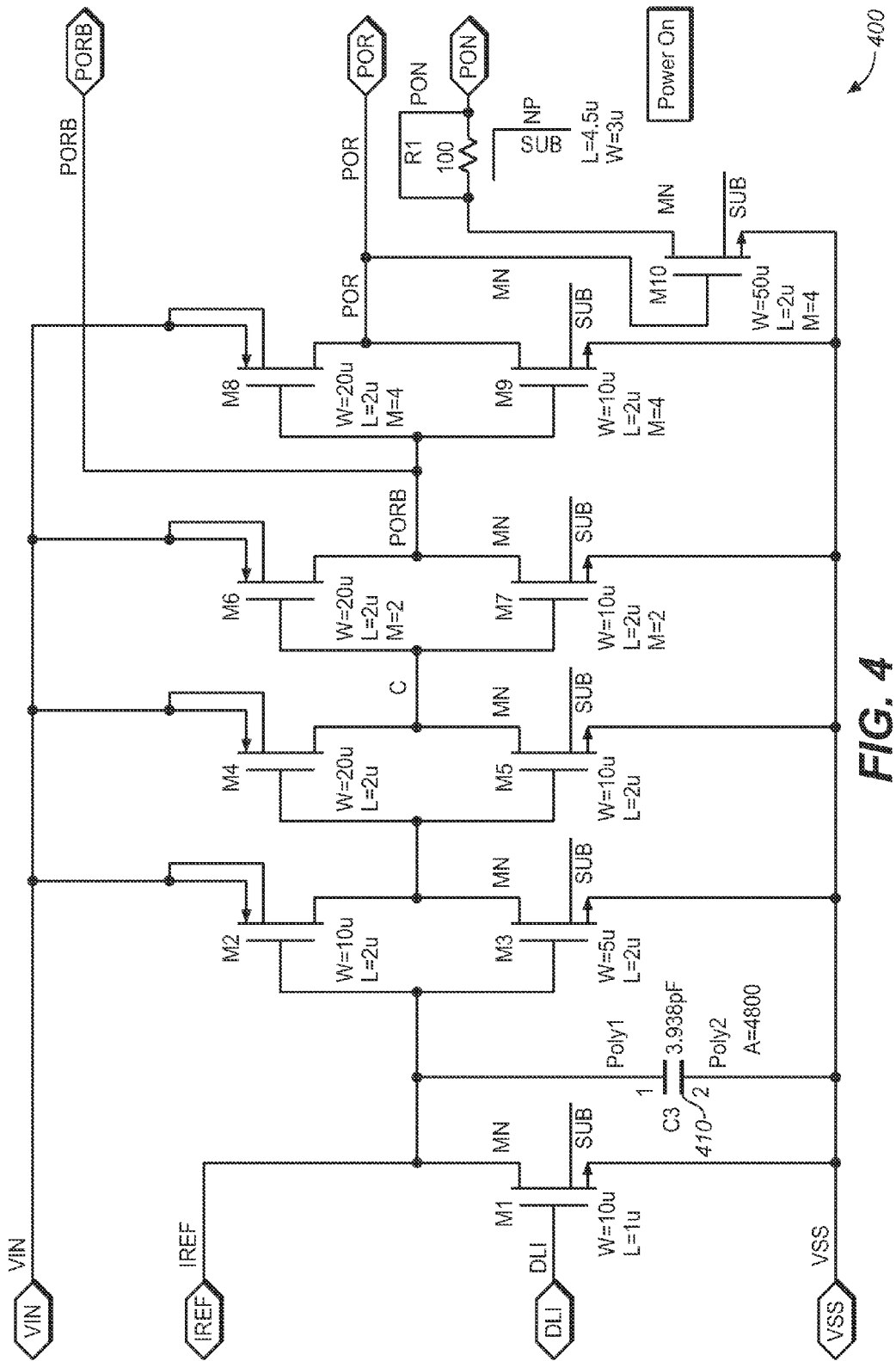
FIG. 4 depicts a delay circuit (400) in one implementation of the present invention; and, FIG. 5 depicts a modified core power switch circuit in one implementation of the present invention.

FIG. 4 depicts a delay circuit (400) in one implementation of the present invention. For example, the delay circuit 400 may be implemented as that set forth in FIG. 2 at 230. From FIG. 4, a delay is inserted into the circuit by charging the capacitor C3 (410) of FIG. 4 with current derived from M12 (398) in FIG. 3.

Figure 5:
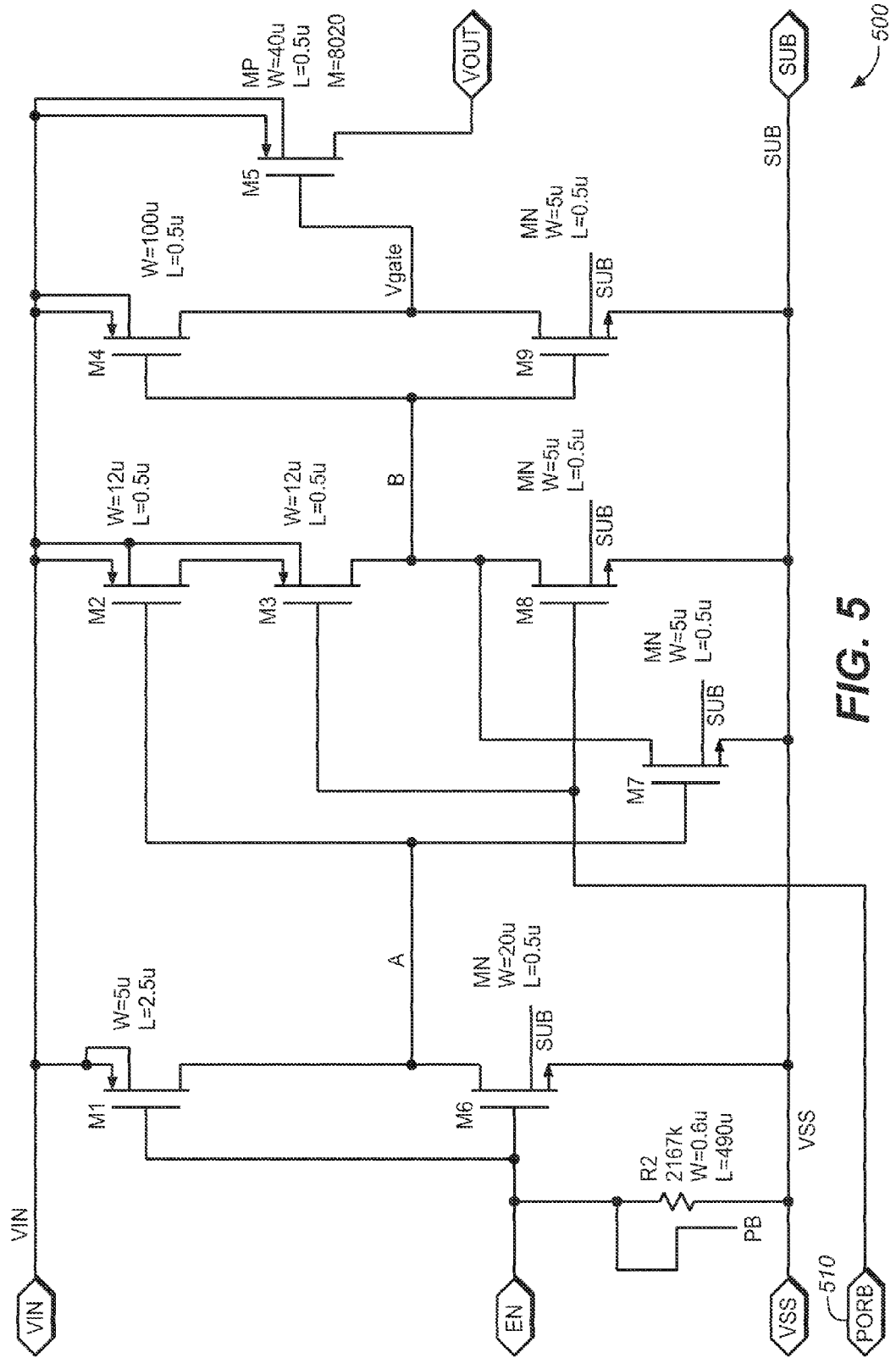

FIG. 5 depicts a modified core power switch circuit 500 in one implementation of the present invention. An active low PORB signal 510 is fed back in main switch block 500 which enable the switch as ON when the input voltage reaches the pre-defined or predetermined minimum lower input voltage value. The active low PORB signal is then inverted (POR) and used at the gate of an open-drain NMOS device to generate a suitable input voltage (PON) for a successive integrated circuit. The POR of the present invention can be used as an enable signal for the successive circuit and the PON can be used as input voltage. Thus, the POR provides an externally controlled voltage to power-up other components in the system when energizing of the first component occurs satisfactorily.

Although the present invention has been described in accordance with the embodiments shown, one of ordinary skill in the art will readily recognize that there could be variations to the embodiments and those variations would be within the spirit and scope of the present invention including implementations in hardware, software or firmware, programmable or otherwise. For instance a switch of various implementations of the present invention may also be a processor, electronic device, programmable integrated circuit, or similar. Accordingly, many modifications may be made by one of ordinary skill in the art without departing from the spirit and scope of the appended claims.

The invention claimed is:

1. A power switch circuit comprising:
a power switch including a P-channel Metal Oxide Semiconductor (PMOS) which receives an input voltage, a buffer, and a level-shifter circuit;
a power-on reset (POR) circuit configured for a peaking current technique to generate a current and for generating a power-on reset (POR) signal, wherein the POR circuit comprises two NMOS transistors, four PMOS transistors and three resistors, wherein the two NMOS transistors and the three resistors are configured to generate a small current and utilizing the small current to generate a power-on reset signal when the input voltage reaches two times the threshold voltage of the PMOS;

a delay circuit coupled to the POR circuit, the delay circuit comprising a plurality of the buffer stages, the delay circuit providing an active POR signal;

and an active low reset (PORB) signal for enabling a control loop of the power switch wherein the active POR signal provides for activating the switch by the PORB signal at a predetermined voltage being at least of a minimum lower input voltage.

2. The power switch circuit of claim 1, further comprising at least one successive integrated circuit.

3. The power switch circuit of claim 1, wherein the peaking current technique generates a small current to define a state at a point A of the POR circuit as low, whereinafter when an input voltage reaches two times a threshold voltage, current is provided to change the state of point A from low to high.

4. The power switch circuit of claim 3, wherein a further delay is inserted into the circuit by charging a capacitor in a predetermined manner.

5. A method of implementing a power-on reset in a power switch circuit to enable the switch at a predefined voltage and to power-up successive integrated circuits, the method comprising:

providing for a power switch including a P-channel Metal Oxide Semiconductor (PMOS) which receives an input voltage, a buffer, and a level-shifter circuit;

providing for a power-on reset (POR) circuit configured for a peaking current technique to generate a current and for generating a power-on reset (POR) signal, wherein the POR circuit comprises two NMOS transistors, four PMOS transistors and three resistors, wherein the two NMOS transistors and the three resistors are configured to generate a small current and utilizing the small current to generate a power-on reset signal when the input voltage reaches two times the threshold voltage of the PMOS;

providing for a delay circuit coupled to the POR circuit, the delay circuit comprising a plurality of the buffer stages, the delay circuit providing an active POR signal;

and providing for an active low reset (PORB) signal for enabling a control loop of the power switch.

6. The method of claim 5, further comprises the peaking current technique generating a small current to define a state at a point A of the POR circuit as low, whereinafter when an input voltage reaches two times a threshold voltage, providing current and changing the state of point A from low to high.

7. The method of claim 6, further comprising inserting a further delay into the circuit by charging a capacitor in a predetermined manner.

8. An integrated circuit comprising:
a power switch which receives an input voltage;
a power-on reset (POR) circuit configured for a peaking current technique to generate a current and for generating a power-on reset (POR) signal, wherein the POR circuit comprises two NMOS transistors, four PMOS transistors and three resistors, wherein the two NMOS transistors and the three resistors are configured to generate a small current and utilizing the small current to generate a power-on reset signal when the input voltage reaches two times the threshold voltage of the PMOS;

a delay circuit; coupled to the POR circuit, the delay circuit comprising a plurality of the buffer stages, the delay circuit providing an active POR signal;

one or more successive integrated circuits;

and an active low reset (PORB) signal for enabling a control loop of the power switch, wherein the active POR signal provides for activating the switch by the PORB signal at a predetermined voltage being at least of a minimum lower input voltage.

9. The integrated circuit of claim 8, further comprising a plurality of successive integrated circuits.

10. The integrated circuit of claim 9, wherein the peaking current technique generates a small current to define a state at a point A of the POR circuit as low, whereinafter when an input voltage reaches two times a threshold voltage, current is provided to change the state of point A from low to high.

11. The integrated circuit of claim 10, wherein in response to a voltage rise of a voltage supply, the circuit generates a signal consistent with a leading part of the POR signal.

12. The integrated circuit of claim 11, wherein a further delay is inserted into the circuit by charging a capacitor in a predetermined manner.

13. A power switch circuit comprising:
a power switch including a P-channel Metal Oxide Semiconductor (PMOS) which receives an input voltage, a buffer, and a level-shifter circuit;

a power-on reset (POR) circuit configured for a peaking current technique to generate a peaking current and for generating a power-on reset (POR) signal, wherein the POR circuit comprises two NMOS transistors, four PMOS transistors and three resistors, wherein the two NMOS transistors and the three resistors are configured to generate a small current and utilizing the small current to generate a power-on reset signal when the input voltage reaches two times the threshold voltage of the PMOS;

a delay circuit coupled with the POR circuit, the delay circuit including a plurality of buffer stages coupled with a current reference input node (IREF) and a capacitor, wherein the current reference input node (IREF) is configured for receiving a reference current derived from the POR circuit, the delay circuit providing an active POR signal, and an active low reset (PORB) signal for enabling a control loop of the power switch, wherein the active POR signal provides for activating the switch by the PORB signal at a predetermined voltage being at least of a minimum lower input voltage.

* * * * *